United States Patent [19]

Rocchi

[11] Patent Number: 4,623,801
[45] Date of Patent: Nov. 18, 1986

[54] DIVIDE-BY-TWO FREQUENCY DIVIDER

[75] Inventor: Marc Rocchi, Emerainville, France

[73] Assignee: U.S. Philips Corporation, New York, N.Y.

[21] Appl. No.: 622,351

[22] Filed: Jun. 19, 1984

[30] Foreign Application Priority Data

Jun. 29, 1983 [FR] France ................... 83 10739

[51] Int. Cl.$^4$ ............. H03K 3/289; H03K 3/356; H03K 19/017; H03K 19/20
[52] U.S. Cl. ................. 307/272 A; 307/279; 307/450; 307/475
[58] Field of Search ............ 307/272 A, 446, 450, 307/475, 279; 377/116, 117

[56] References Cited

U.S. PATENT DOCUMENTS

| 4,450,369 | 5/1984 | Scheurmeyer | 307/475 X |
| 4,491,747 | 1/1985 | Shimizu | 307/450 X |
| 4,514,649 | 4/1985 | Nuzillat et al. | 307/450 |

OTHER PUBLICATIONS

Cathelin et al, "A 3-5 GHz Self-Aligned Single--Clocked Binary Frequency Divider on GaAs"; *IEE Proc.*, vol. 127, Pt. I, No. 5, pp. 270-277; 10/1980.

Nuzillat et al, "Low Pinch-Off Voltage FET Logic"; *IEE Proc,* vol. 127, Pt. I, No. 5, pp. 287-296; 10/1980.
Dreyfack, "Gallium Arsenide to Yield 5-GHz Divider"; *Electronics;* pp. 76 & 78; 10/9/1980.

Primary Examiner—Larry N. Anagnos
Attorney, Agent, or Firm—Thomas A. Briody; William J. Streeter; Leroy Eason

[57] ABSTRACT

An integrated divide-by-two frequency divider circuit in BFL logic of the master-slave flip-flop type which comprises two complementary outputs Q and $\bar{Q}$ and only a single input for a control signal. The divider is formed only by NOR gates and wired-OR gates. The master does not have a memory function and the various transistors are proportioned so that, $\tau_1$ being the transit time in the master, $\tau_3$ the transit time in the first and the second NOR-gate ($G_3$ and $G_4$) of the slave, and $\tau_4$ the transit time in the fourth and the third NOR gate ($G_4$ and $G_5$) of the slave, the following inequality is satisfied $\tau_1 = 1(\tau_3 + \tau_4)$, thus resulting in a maximum operating frequency which is defined by the relation $f_{max} = 1/(\tau_1 + \tau_3 + \tau_4)$. This circuit is integrated by means of depletion MESFET transistors on a gallium arsenide substrate in a technology including inverter-type gates which are followed by a level translator stage. The invention is used for processing of signals in the gigahertz frequency range of up to 5 GHz.

5 Claims, 5 Drawing Figures

DIMENSIONS IN FIG.2a

| | $G_1$ AND $G_2$ | $G_3$ AND $G_6$ | $G_4$ AND $G_5$ |
|---|---|---|---|
| $T_1$ AND $T_2$ | 0.8 W | 1.25 W | 2.5 W |
| $T_3$ | 0.6 W | W | W |
| $T_4$ | W | 2.5 W | 2.5 W |
| $T_5$ | | 4.25 W ||
| $D_1$ AND $D_2$ | 0.85 W | 4.25 W ||

FIG. 4

DIVIDE-BY-TWO FREQUENCY DIVIDER

The invention relates to an integrated divide-by-two frequency divider circuit of the master-slave flip-flop type which comprises two complementary outputs Q and $\overline{Q}$ in BFL logic and only one input for a control signal in the gigahertz frequency range.

The physical-chemical properties of gallium arsenide allow for the manufacture of integrated circuits operating at a very high speed or in the gigahertz frequency range. Such technology is described, for example in IEEE Journal of Solid State Circuits, Vol. SC 17, June 1982, No. 3, pages 569–584, by G. Nuzillat et al and utilizes as the active element metal Schottky field effect transistors (MESFET) which are formed on an active N-type layer. The inverter function is formed by a common source transistor (source connected to ground) which is associated with a load which may be active, for example a transistor whose gate-electrode and source are short-circuited, said gate-source connection being connected to the drain of the inverter transistor, the drain of the load transistor being connected to the d.c. power supply which is referred to as $V_{DD}$, the signal input being situated on the gate-electrode of the inverter transistor whilst the signal output is situated on the drain of this transistor.

When a depletion MESFET transistor (DMESFET) is chosen for the inverter transistor for which the pinch-off voltage is $V_T<0$, the output of an inverting gate is not compatible with the input of another gate. It is then necessary to use a level translator stage which is generally formed by a common drain transistor (drain connected to the d.c. power supply $V_{DD}$) which operates as an impedance matching and follower stage. The level translation is performed by diodes which are polarized by a current source which is formed by a supplementary field effect transistor whose gate-electrode and source are short-circuited and connected to a d.c. voltage $V_{SS}$ which differs from ground. The signal output thus occurs on the drain of the latter transistor which, however, is connected to the diodes.

The complete inverter may be formed by the inverter stage which is either followed or preceded by the level translator stage. The reference used to indicate that use is made of a DMESFET inverter stage followed by a level translator stage is "BFL logic" (Buffered FET Logic).

In BFL logic, the configurations enabling the formation of the NOR and NAND functions are the same as the functions used in MOS logic (Metal Oxide Semiconductor), be it that use must be made of the level translator stage.

It is also to be noted that in such BFL logic the OR function may be formed by connecting the diodes of the translator stages of the two inverters in common, thus forming a wired-OR function without increasing the propagation time of the signal.

It is now important to define the time propagation time delay Tpd which is the minimum period of time required for a charge on the gate-electrode of a translator to induce the transfer, across the channel of this transistor, of an identical charge to the gate-electrode of the transistor of the subsequent stage.

For gallium arsenide circuits it is also known to use gates in which the inverter transistor is of the enrichment type (the pinchoff voltage $V_T>0$). In that case each gate is compatible with the next gate. This type of logic is referred to as DFCL (Direct Coupled FET Logic). Finally, the logic which utilizes a gate in the form of an inverter stage which is preceded by the translator stage is referred to as SDFL (Schottky Diode FET Logic) or FFL (Follower FET Logic).

The results of research performed during recent years show that, when the different types of logic using the MESFET are compared, the logic BFL-2 diodes (when the translator stage comprises two diodes) enables the shortest time propagation delays to be obtained. On the other hand, this BFL logic in which the transistors comprise thick layers (150 nm or 0.150 μm for N-type doping of about $2.10^{-17}$ cm$^{-3}$) is not only fast but can also be easily realized.

Considering the foregoing it appears that in order to form a divide-by-two frequency divider of the master slave flip-flop type T in the gigahertz frequency range, three conditions must be satisfied:

1. The circuits must be manufactured at a large scale, in the order of several millions, which results in a reduced manufacturing cost and a technology which can be readily carried out.
2. The circuits must operate in the gigahertz frequency range, that is to say at a frequency in the order of 5 GHz.
3. The gates must have a time propagation delay in the same order of magnitude as the period in order to allow the master-slave flip-flop to operate as voltage divider.

It follows from the above investigations of the state of the art that the three conditions imposed can be satisfied by forming a gallium arsenide T-type master-slave flip-flop circuit in BFL logic.

However, when merely the known master-slave flip-flop circuits described in the above document are simply and purely transposed, the benefits of the speed of this type of logic are lost. Moreover, there is a risk that there will only be obtained an unstable circuit which does not function. Actually, in such a flip-flop speed is always synonymous with instability.

Finally, the said documents described circuits utilizing each time NOR and NAND gates. However, the BFL logic cannot utilize NAND gates for the following reason: a NAND-gate is formed by two transistors in series which represent two non-eqivalent inputs. For a typical supply voltage of 4 V in BFL logic, that one of the two transistors which is connected in common source arrangement receives on its gate-electrode a voltage varying between 0.5 and −5 V, which implies a voltage of at least 0.3 V on the junction between these two transistors. Thus, no more than 0.2 V may be present between the gate-electrode and the source of the second transistor. This causes a significant deterioration of the logic level "1".

The present invention offers a solution to the various problems posed in the preamble; the invention offers a divide-by-two frequency divider which is formed by a flip-flop T and is characterized in that first of all the "master" is formed by two NOR gates ($G_1$, $G_2$), the first NOR gate $G_1$ admitting to the inputs the control signal H and the first fed back output signal $\overline{Q}$, the second NOR gate $G_2$ admitting to the inputs the same control signal H and the second fed back output singal Q, the "slave" being formed by four NOR gates ($G_3$, $G_4$, $G_5$ and $G_6$). the first NOR gate $G_3$ admitting to the inputs the output signal $E_1$ of the first NOR gate $G_1$ of the "master" and the first fed back output signal $\overline{Q}$, the second NOR gate $G_4$ admitting to the inputs the first output signal $\bar{Q}$ and the control signal H, the third NOR gate $G_5$ admitting to the inputs the control signal H and the fed back second output signal Q, the fourth NOR gate $G_6$ admitting to the inputs the second fed back output signal Q and the output signal $E_2$ of the second NOR gate $G_2$ of the master, the outputs of the first two NOR gates $G_3$ and $G_4$ of the slave being interconnected in the form of a wired-OR gate ($G_7$) in order to produce the second output signal Q, the outputs of the last two gates $G_5$ and $G_6$ of the slave being interconnected in the form of a wired-OR gate ($G_8$) ir order to produce the first output signal $\bar{Q}$.

Thus, a preferred embodiment of the frequency divider in accordance with the invention is integrated on a gallium arsenide substrate in BFL logic, is completely formed by means of NOR gates, and is characterized in that the various transistors are proportioned so that the transit time $\tau_1$ in the master, the transit time $\tau_3$ of the first and the second NOR gates $G_3$ and $G_4$ of the slave, and the transit time $\tau_4$ of the third and fourth NOR gates $G_5$ and $G_6$ produce the following inequality: $\tau_1 > (\tau_3 + \tau_4)$. The frequency divider thus has a shorter total time propagation delay, a low power consumption and a stable operation in the gigahertz frequency range.

The invention will be described in detail hereinafter with reference to the accompanying drawing.

FIG. 4 is a table stating the dimensions of the transistors.

Figure 1:
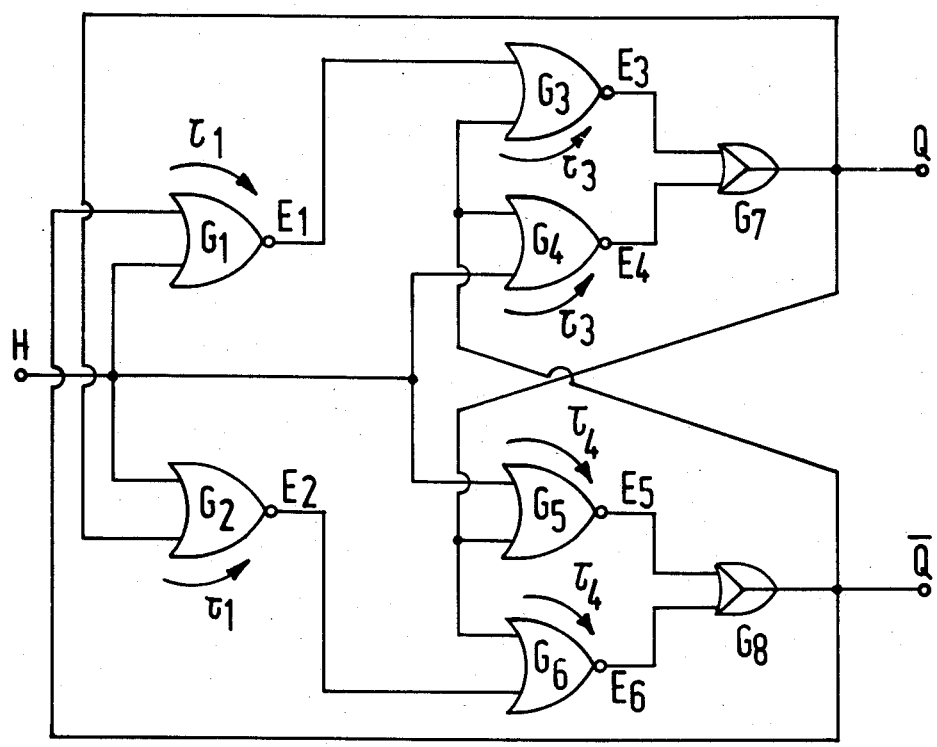
FIG. 1 shows the electrical diagram of the master slave T-type flip-flop circuit formed by means of NOR gates and OR gates.

As shown in FIG. 1, the circuit in accordance with the invention is formed by two stages, a master stage and a slave stage. The master stage comprises the two NOR gates $G_1$ and $G_2$ and the slave stage comprises the four NOR gates $G_3$, $G_4$, $G_5$, $G_6$ as well as the wired-OR gates $G_7$ and $G_8$; the latter gates do not have any supplementary transit time. The control signal H is applied to an input of each of the gates $G_1$ and $G_2$ of the master as well as to one input of each of the gates $G_4$ anf $G_5$ of the slave, so that these gates $G_4$ and $G_5$ have a special function.

The master does not have a memory effect and the outputs Q and $\bar{Q}$ of the wired-OR gates $G_7$ and $G_8$ form the second inputs of the gates $G_2$ and $G_1$, respectively. The transit time in a gate $G_1$ or $G_2$ is denoted as $\tau_1$.

However, the slave stage has a memory effect and the short-circuited outputs $E_3$ and $E_4$ of $G_3$ and $G_4$ form the second output signal Q which is fed back to one of the inputs of $G_5$ and $G_6$. Similarly, the short-circuited outputs $E_5$ and $E_6$ of $G_5$ and $G_6$ form the first output signal $\bar{Q}$ (complementary Q) which is fed back to one of the inputs of $G_3$ and $G_4$. Finally, the second input of $G_3$ and $G_5$ is connected to the outputs $E_1$ and $E_2$ of $G_1$ and $G_2$, respectively. The transit time in $G_3$ or $G_4$ is denoted as $\tau_3$, and the transit time in $G_5$ or $G_6$ is denoted as $\tau_4$.

Figure 3:
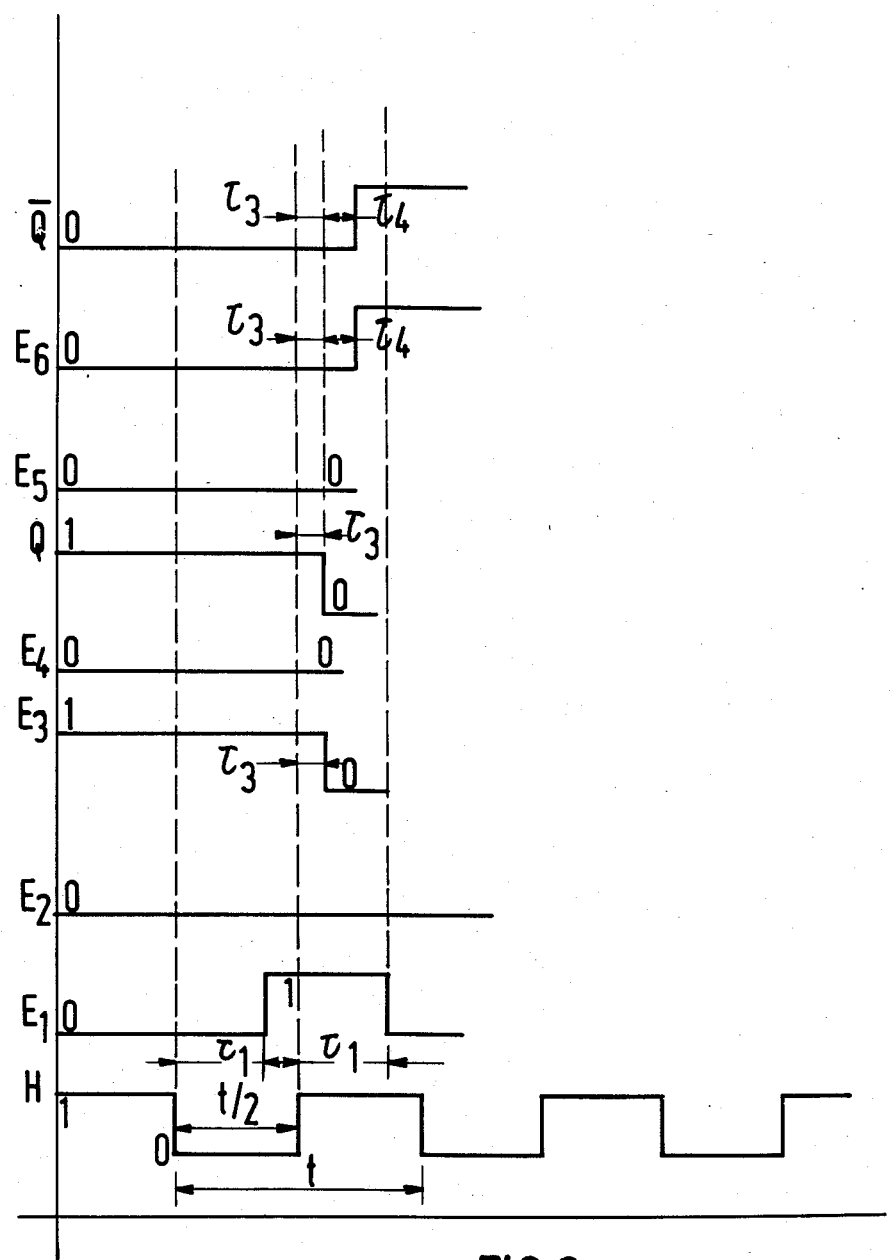
FIG. 3 shows the various signal level positions for each of the logic gates in conjunction with the indicated input and output signals.

As indicated in FIG. 3, when the control signal H is high (H=1), the outputs $E_1 = E_2 = 0$, which means that the outputs $E_3 = E_1$, $E_4 = 0$, so Q=1 and that $E_5 = E_6 = 0$ and $\bar{Q} = 0$. When the signal H changes from 1 to 0, assuming that initially Q=1 and $\bar{Q} = 0$, $E_1$ becomes 1 after a period of time $\tau_1$ and $E_2$ remains 0. The other states remain the same. Only the master is activated. After a period $\tau_1$ after the transition of the signal H, the information will be present on the slave.

When the signal H changes from 0 to 1, the information $E_1 = 1$ is the only information present on the slave, together with the signal H=1 and the previous information Q=1, $\bar{Q} = 0$. As a result, after a period of time $\tau_3$ after this transition of the signal H, $E_3 = 0$, $E_4 = 0$ and Q=0. Thus, a supplementary period of time $\tau_4$ is necessary in order to ensure that, by making Q=0 again as has just been done, on $G_5$ and $G_6$ there is obtained $E_5 = 0$ and $E_6 = 1$, which results in $\bar{Q} = 1$. However, this operation must be terminated before the information $E_1 = 0$ produced by the transition of the signal H from 0 to 1, arrives and disturbs the final stage of the flip-flop action of the slave.

It has already been noted that a period of time $\tau_3$ is required for Q to change over and another period of time $\tau_4$ for $\bar{Q}$ to change over. When $\tau_1$ is the transit time in $G_1$, $\tau_1$ must be larger than or equal to $(\tau_3 + \tau_4)$ in order to ensure that $E_1$ does not disturb the flip-flop action.

Because a period of time $\tau_1$ is required for the information to circulate in the master and a period of time $\tau_3$ and $\tau_4$ for the information to become available on the output of the slave, the maximum operating frequency is given by the relation:

$$f_{max} = 1/(\tau_1 + \tau_3 + \tau_4).$$

The maximum frequency is thus higher than that obtained by circuits in which the master and the slave have a memory function and in which in that case:

$$f_{max} \simeq \tfrac{1}{4}\tau,$$

$\tau$ being the propagation time delay of the gate.

By choosing $$\tau_1 \simeq 2\tau_3 \simeq 2\tau_4 \simeq t/2,$$

being the period of the control signal, the frequency of the output signal is given by the relation $f = 1/2t$.

Figure 2A:
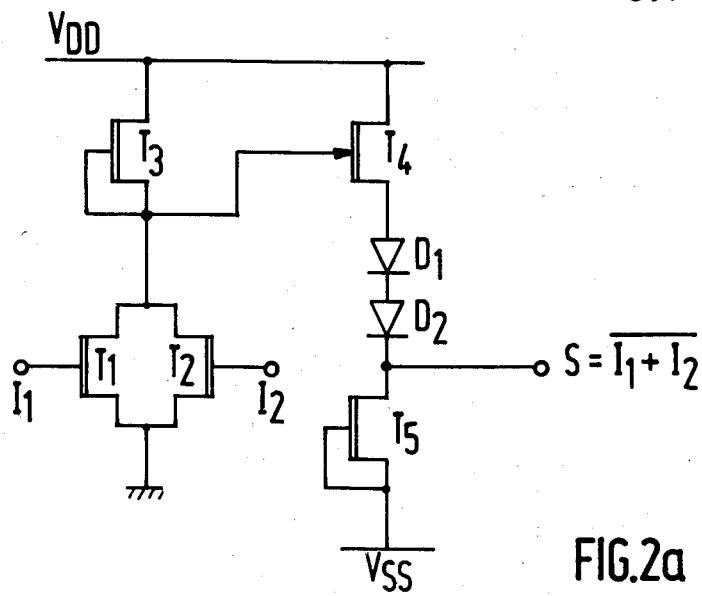
FIG. 2a shows the diagram of a NOR gate in BFL logic.

As appears from FIG. 2a, the NOR gate in BFL logic comprises two common source depletion MESFET transistors $T_1$ and $T_2$ which are connected in parallel and whose drain is connected to the short-circuited source electrodes of the common drain charge transistor $T_3$. The drain of the transistors $T_1$ and $T_2$ is connected to the gate-electrode of the common drill transistor follower $T_4$ whose source is connected to two diodes $D_1$ and $D_2$ which are connected in series between $T_4$ and the current source $T_5$. The two equivalent inputs of the NOR gate are situated on the gate-electrodes of the transistors $T_1$ and $T_2$. The output is situated on the drain of the transistor $T_5$ between $T_5$ and $D_2$.

Figure 2B:
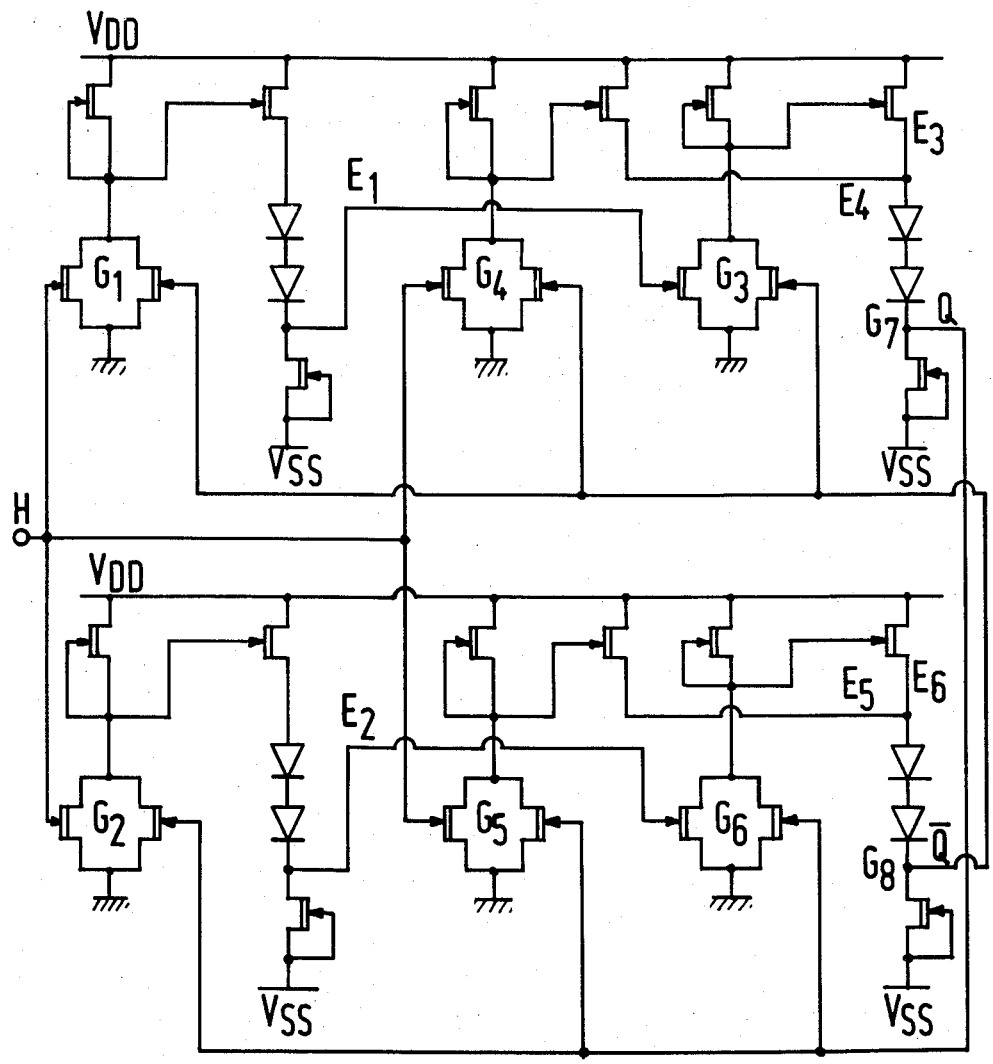
FIG. 2b shows the electrical diagram of the master-slave T-type flip-flop circuit in which the symbolic configuration of the NOR gates is replaced by a representation in inverter gates in BFL logic as defined in the preambule.

As appears from FIG. 2b, the logic diagram of FIG. 1 is designated by means of NOR gates which are shown in FIG. 2a.

However, the wired-OR gate is obtained in a specific manner. For the gates $G_3$ and $G_4$, the diodes $D_1$ and $D_2$ as well as the transistor $T_5$ are connected in common. For the assembly of these two gates, therefore, there are 2 transistor followers $T_4$, but a single transistor stage with $D_1$, $D_2$, $D_5$. The output Q is situated on the drain of the common transistor $T_5$. This is the same for the gates $G_5$ and $G_6$. The output $\overline{Q}$ appears on the drain of the common transistor $T_5$.

In order to obtain a transit time $\tau_1 \geqq (\tau_3 + \tau_4)$, i.e. such that initially the gates of the master and the slave are identical, either the transit time in the master can be increased or the transit time in the slave can be decreased. However, it is not advantageous to increase the transit time in the master, because the maximum frequency at which the circuit can operate is thus reduced. Thus, in these circumstances it is necessary to decrease the transit time in the slave.

A first solution consists in increasing dimensions the transistors $T_1$ and $T_2$ of the NOR gates of the slave, which has the drawback that their power consumption is thus increased. However, the power consumption of the slave may be slightly increased due to the fact that the gates of the master, coming from 1, are very small and have an extremely low dissipation.

Another solution is to shift the threshold level of the gates of the master. The desired delay is thus obtained and there will be absolutely no oscillation problems.

The solution which offers the best results is to manipulate the dimensions of the transistors and the polarization of the translator stages.

In a preferred embodiment, the dimensions for the transistors are chosen from the table 4, in which W is the unit size of the transistor.

In the case where
$W = 20 \mu m$
$V_{DD} = 4 V$
$V_{SS} = -3 V$ with a pinchoff voltage $V_T = -2$ and
where the gate length L of a transistor is 0.6 $\mu m$,
a maximum frequency
$f_{max} = 5$ GHz
is obtained and a dissipated power P=280 mW.

This represents a substantial progress, considering that the value 4 GHz for the frequency is very difficult to surpass by means of the circuits manufactured according to known diagrams.

The circuit in accordance with the present invention thus enables an integrated divide-by-two frequency divider to be realized in the gigahertz frequency range which has a low power consumption and a lower cost price.

It will be apparent that on the one hand the application of the invention to processing of signals up to 5 GHz is not limitative and on the other hand that there are many modifications feasible within the scope of the invention as will become apparent from the following claims.

What is claimed is:

1. An integrated divide-by-two frequency divider circuit comprising master-slave flip-flop stages having first and second complementary outputs Q and $\overline{Q}$ in buffered FET logic and a single input for a control signal H in the gigahertz frequency range, characterized in that:

the master stage comprises two NOR gates ($G_1$, $G_2$), the first of which ($G_1$) has first and second inputs connected to receive the control signal H at the second input and the output signal $\overline{Q}$ at the first input by a first feedback path, the said first NOR gate ($G_1$) having an output of which it produces an output signal $E_1$; the second NOR gate ($G_2$) of the master stage having first and second inputs connected to receive the control signal H at the first input and the output signal Q at the second input by a second feedback path, such second NOR gate ($G_2$) having an output of which it produces an output signal $E_2$;

the slave stage comprises four NOR gates ($G_3$, $G_4$, $G_5$ and $G_6$), the first of which ($G_3$) has first and second inputs connected to receive said output signal $E_1$ at the first input and to receive said output signal $\overline{Q}$ at the second input by a third feedback path; the second NOR gate ($G_4$) of the slave stage having first and second inputs connected to receive said output signal $\overline{Q}$ at the first input by said third feedback path and to receive said control signal H at the second input; the third NOR gate ($G_5$) of the slave stage having first and second inputs connected to receive said control signal H at the first input and said output signal Q at the second input by a fourth feedback path; and the fourth NOR gate ($G_6$) of the slave stage having first and second inputs connected to receive said output signal Q at the first input by said fourth feedback path and to receive said output signal $E_2$ at the second input;

the first two NOR gates ($G_3$ and $G_4$) of the slave stage respectively having outputs which are interconnected by a wired-OR gate ($G_7$) producing such output signal Q, and the second two NOR gates ($G_5$ and $G_6$) of the slave stage respectively having outputs which are interconnected by a further wired-OR gate ($G_8$) producing said output signal $\overline{Q}$.

2. A circuit as claimed in claim 1, characterized in that it is an integrated circuit comprising a plurality of depletion MESFET transistors on a gallium arsenide substrate, such transistors forming inverter type gates which are followed by a level translator stage.

3. A circuit as claimed in claim 1, characterized in that it is an integrated circuit comprising a plurality of transistors, the various transistors being proportioned so that the transit time $\tau_1$ in the master stage ($G_1$, $G_2$), the transit time $\tau_3$ in the first and the second NOR gates ($G_3$, $G_4$) of the slave stage, and the transit time $\tau_4$ in the third and fourth NOR gates ($G_5$, $G_6$) of the slave stage produce the following inequality:

$$\tau_1 \geqq /(\tau_3 + \tau_4).$$

4. A circuit as claimed in claim 3, characterized in that the maximum operating frequency of the control signal H is defined by the relation:

$$f_{max} = 1/(\tau_1 + \tau_3 + \tau_4).$$

5. A circuit as claimed in any one of the claims 1, 2 and 3, characterized in that the frequency of the control signal H is of the order of magnitude of 5 GHz.

* * * * *